(12) United States Patent
Park et al.

(10) Patent No.: US 12,476,209 B2
(45) Date of Patent: Nov. 18, 2025

(54) WAFER LEVEL CHIP SCALE PACKAGE OF POWER SEMICONDUCTOR AND MANUFACTURING METHOD THEREOF

(71) Applicant: Magnachip Semiconductor, Ltd., Cheongju-si (KR)

(72) Inventors: Myungho Park, Cheongju-si (KR); Heejin Park, Cheongju-si (KR); Beomsu Kim, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 392 days.

(21) Appl. No.: 17/947,324

(22) Filed: Sep. 19, 2022

(65) Prior Publication Data

US 2023/0299026 A1 Sep. 21, 2023

(30) Foreign Application Priority Data

Mar. 17, 2022 (KR) .................. 10-2022-0033131

(51) Int. Cl.
*H01L 23/00* (2006.01)

(52) U.S. Cl.
CPC ............... *H01L 24/05* (2013.01); *H01L 24/03* (2013.01); *H01L 24/13* (2013.01); *H01L 24/29* (2013.01);
(Continued)

(58) Field of Classification Search
CPC ......... H01L 24/05; H01L 24/03; H01L 24/13; H01L 24/29; H01L 2224/0345; H01L 2224/03614; H01L 2224/03622; H01L 2224/05005; H01L 2224/05017; H01L 2224/05018; H01L 2224/05084; H01L 2224/05124; H01L 2224/05147; H01L 2224/05166; H01L 2224/05184; H01L 2224/05541; H01L 2224/05557; H01L 2224/05558; H01L 2224/05576; H01L 2224/05666; H01L 2224/05684; H01L 2224/05691; H01L 2224/13007; H01L 2224/13019; H01L 2224/13083; H01L 2224/13144; H01L 2224/13147; H01L 2224/13155; H01L 2224/29007; H01L 2224/29019; H01L 2224/29083; H01L 2224/29144; H01L 2224/29147; H01L 2224/29155; H01L 2924/13091; H01L 2924/30101; H01L 2924/3511; H01L 2924/35121; H01L 2224/03462; H01L 2224/0347; H01L 2224/0401; H01L 2224/05023; H01L 2224/05083;
(Continued)

(56) References Cited

U.S. PATENT DOCUMENTS 8,563,361 B2 10/2013 Xue et al.
2015/0279776 A1* 10/2015 Hu ............... H01L 21/31127
257/668
(Continued)

*Primary Examiner* — Fernando L Toledo
*Assistant Examiner* — Shawn Shaw Muslim
(74) *Attorney, Agent, or Firm* — NSIP Law

(57) ABSTRACT

A wafer level chip scale package includes a semiconductor substrate having a first thickness, an input-output pad formed on the semiconductor substrate, a front metal layer having a second thickness formed on the input-output pad, a back metal layer having a third thickness formed on a bottom of the semiconductor substrate, and a metal bump formed on the semiconductor substrate.

14 Claims, 20 Drawing Sheets

(52) U.S. Cl.
CPC .......... *H01L 2224/0345* (2013.01); *H01L 2224/03614* (2013.01); *H01L 2224/03622* (2013.01); *H01L 2224/05005* (2013.01); *H01L 2224/05017* (2013.01); *H01L 2224/05018* (2013.01); *H01L 2224/05084* (2013.01); *H01L 2224/05124* (2013.01); *H01L 2224/05147* (2013.01); *H01L 2224/05166* (2013.01); *H01L 2224/05184* (2013.01); *H01L 2224/05541* (2013.01); *H01L 2224/05557* (2013.01); *H01L 2224/05558* (2013.01); *H01L 2224/05576* (2013.01); *H01L 2224/05666* (2013.01); *H01L 2224/05684* (2013.01); *H01L 2224/05691* (2013.01); *H01L 2224/13007* (2013.01); *H01L 2224/13019* (2013.01); *H01L 2224/13083* (2013.01); *H01L 2224/13144* (2013.01); *H01L 2224/13147* (2013.01); *H01L 2224/13155* (2013.01); *H01L 2224/29007* (2013.01); *H01L 2224/29019* (2013.01); *H01L 2224/29083* (2013.01); *H01L 2224/29144* (2013.01); *H01L 2224/29147* (2013.01); *H01L 2224/29155* (2013.01); *H01L 2924/13091* (2013.01); *H01L 2924/30101* (2013.01); *H01L 2924/3511* (2013.01); *H01L 2924/35121* (2013.01)

(58) Field of Classification Search
CPC . H01L 2224/05566; H01L 2224/05568; H01L 2224/05582; H01L 2224/13022; H01L 23/562; H01L 23/293; H01L 23/3114; H01L 24/14; H01L 2224/11011; H01L 2224/12105; H01L 2224/13; H01L 2224/1411
See application file for complete search history.

(56) References Cited

U.S. PATENT DOCUMENTS

| | | | |
|---|---|---|---|
| 2018/0331005 A1* | 11/2018 | Fukuchi | H01L 24/96 |
| 2019/0238134 A1* | 8/2019 | Lee | H03K 19/1776 |
| 2021/0159189 A1* | 5/2021 | Yu | H01L 23/552 |

\* cited by examiner

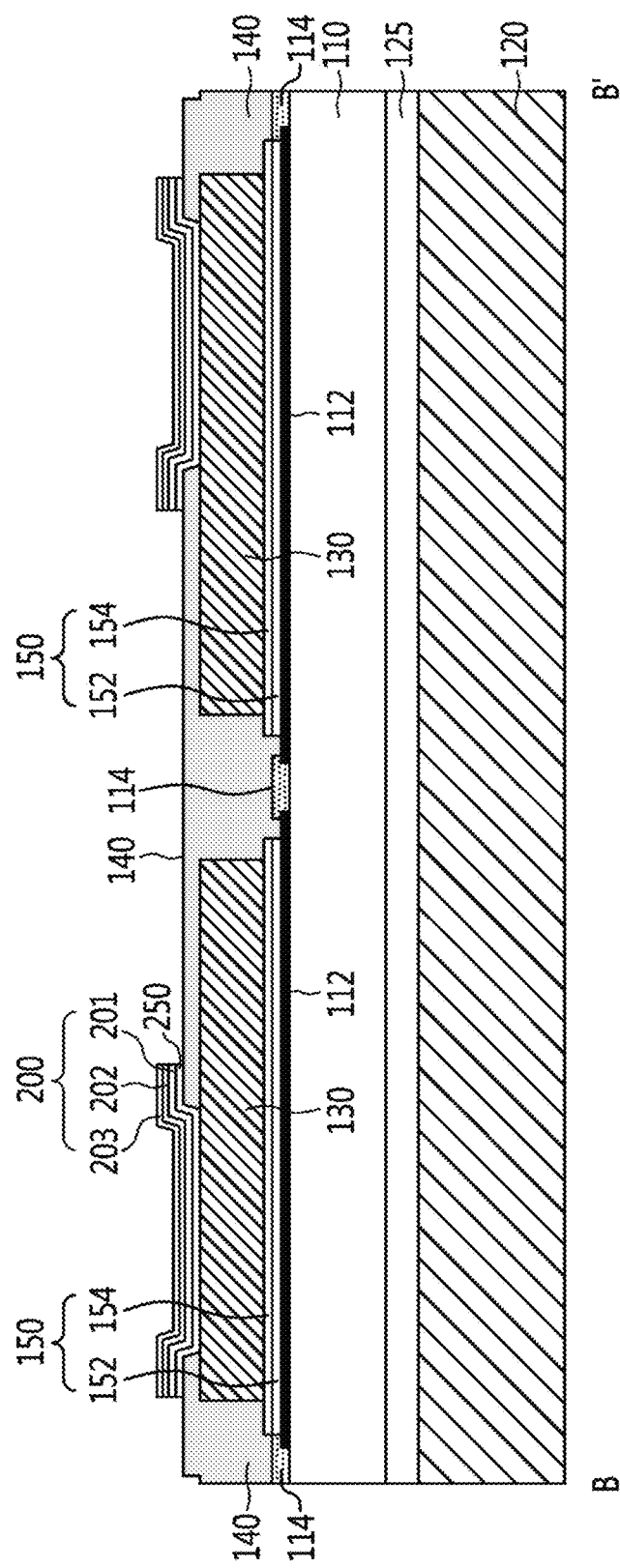

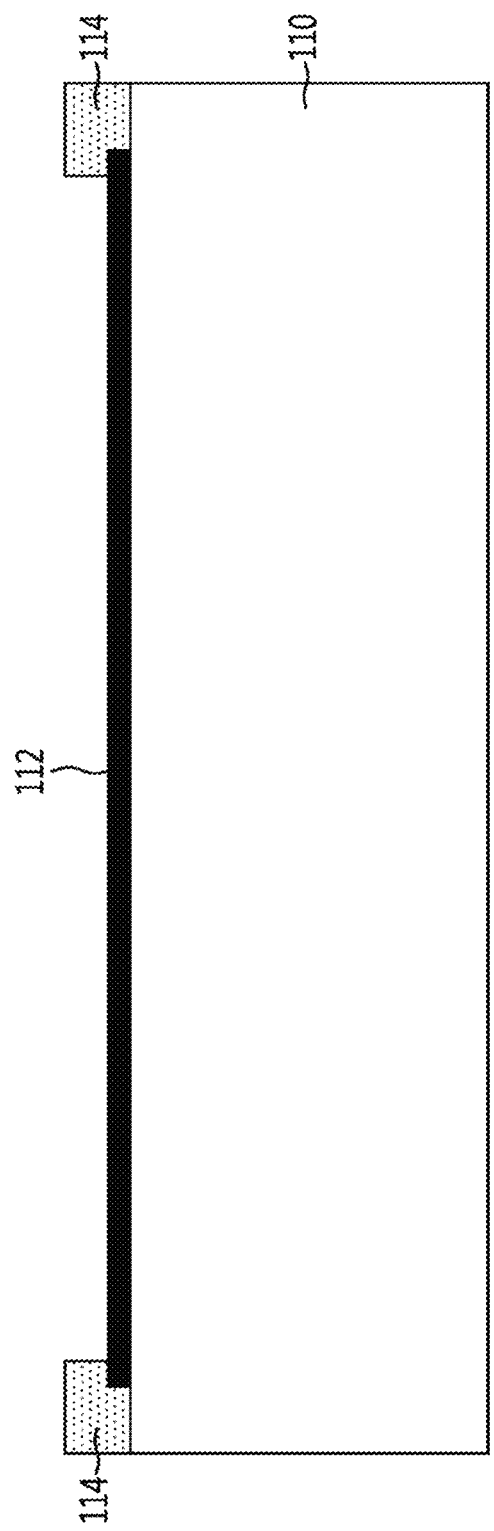

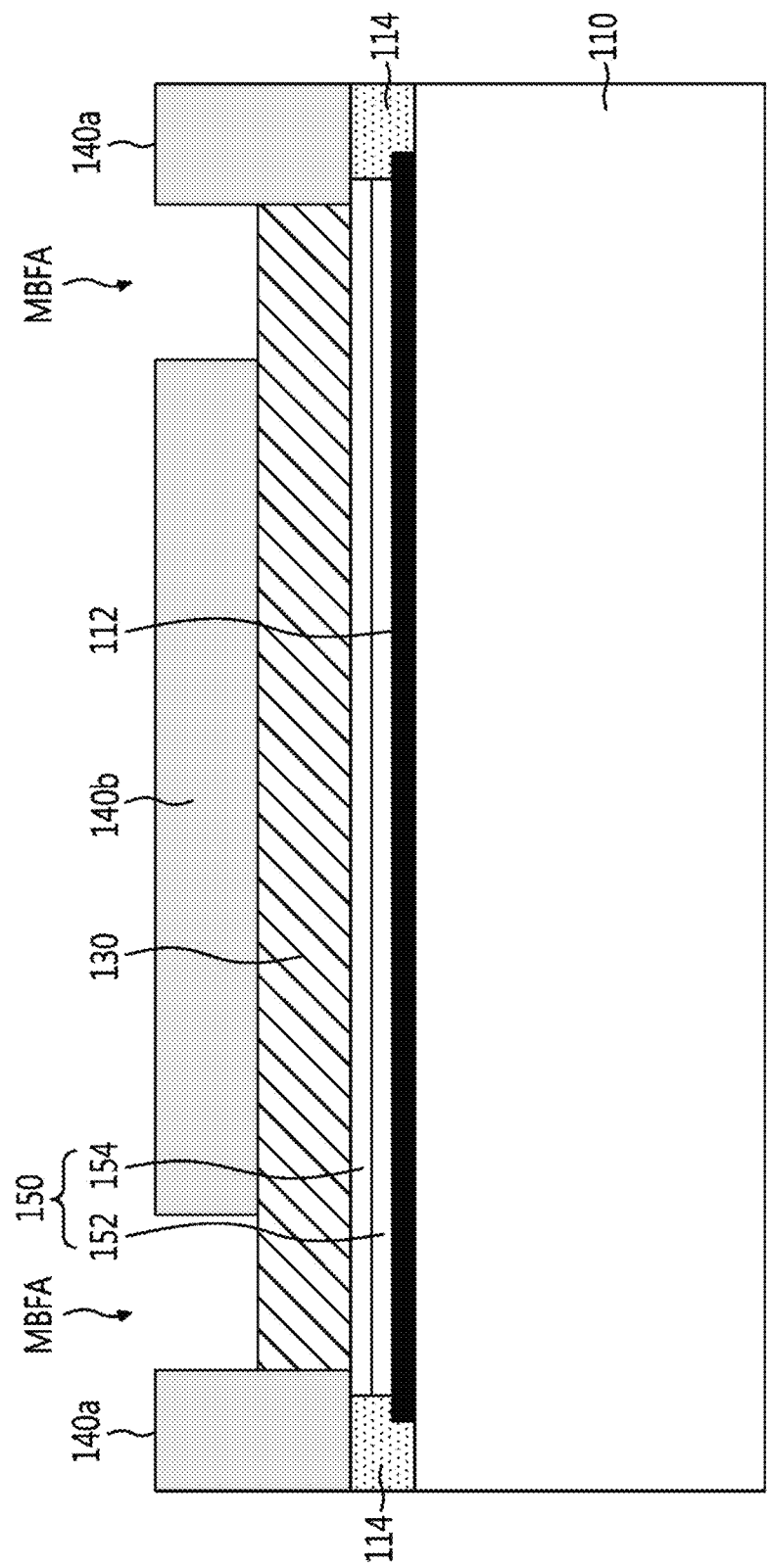

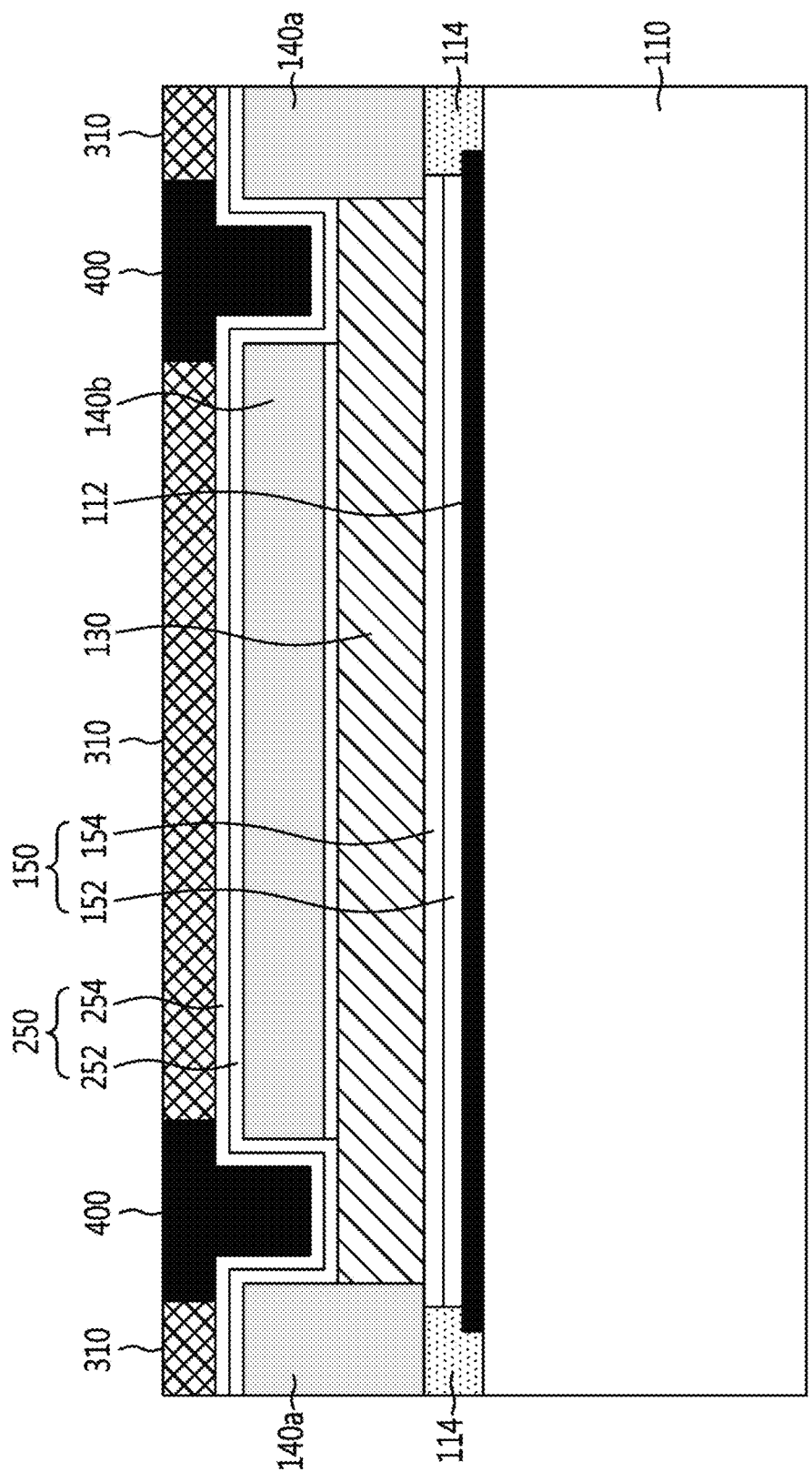

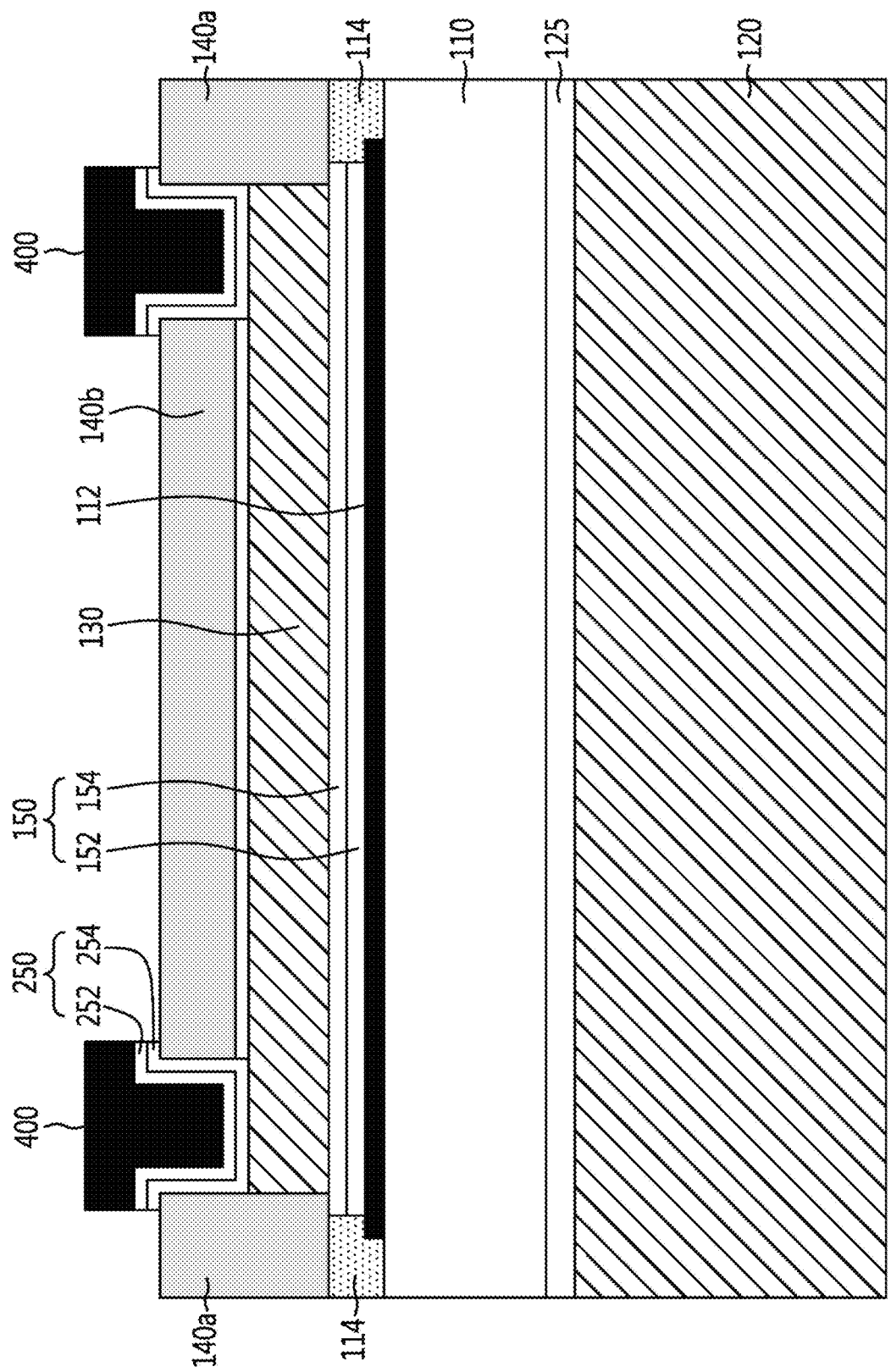

WAFER LEVEL CHIP SCALE PACKAGE OF POWER SEMICONDUCTOR AND MANUFACTURING METHOD THEREOF

CROSS-REFERENCE TO RELATED APPLICATION

This application claims the benefit under 35 U.S.C. § 119 of Korean Patent Application No. 10-2022-0033131 filed on Mar. 17, 2022, in the Korean Intellectual Property Office, the entire disclosure of which is incorporated herein by reference for all purposes.

BACKGROUND

1. Field

The following description relates to a wafer level chip scale package of a power semiconductor and manufacturing method thereof that may prevent a warpage of a semiconductor die due to a difference between coefficients of thermal expansion of a semiconductor substrate and a back metal layer by forming a front metal layer with a predetermined thickness on an upper surface of the semiconductor substrate.

2. Description of Related Art

In these days, one of major trends in a semiconductor industry is to downsize a semiconductor device as much as possible. Accordingly, a chip scale package (chip size package) is suggested to downsize a semiconductor device package to be like a chip. Especially, a wafer level chip scale package (WLCSP) may assemble and manufacture packages all at once from a semiconductor wafer. Therefore, the WLCSP may manufacture the smallest package having a chip size, with low costs and good electronic characteristics.

However, a thickness of package may be reduced according to a type of a power semiconductor. In an example, a typical package thickness is approximately over 100 μm. Since the WLCSP of MOSFET type requires a lower on resistance (Low Ron), that is, a low drain-source resistance (Low Rdson) and low source-source resistance (Rsson), it may be important to design a thinner thickness package than the typical package.

Accordingly, there has been a method of reducing a thickness of the semiconductor substrate and increasing a thickness of the back metal layer in the conventional art.

A back metal layer may be implemented as a common drain electrode, and a resistance of the drain electrode may be reduced by increasing a thickness of the back metal layer.

However, in a package with such a structure, a warpage may occur due to a difference between coefficients of thermal expansion of the semiconductor substrate and the back metal layer, and the warpage may become worse as a thickness of the semiconductor substrate becomes thinner and as a thickness of the back metal layer becomes thicker. In this case, an excessive stress may be applied to the semiconductor device. Therefore, when a package is mounted on a Printed Circuit Board (PCB), the assembly quality may be poor, and the thin semiconductor substrate may crack and destroy.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a wafer level chip scale package includes a semiconductor substrate having a first thickness; an input-output pad formed on the semiconductor substrate; a front metal layer having a second thickness formed on the input-output pad; a back metal layer having a third thickness formed on a lower surface of the semiconductor substrate; and a metal bump formed on the semiconductor substrate.

The first thickness may be less than 60 μm, and the second thickness may range from 10 μm to 60 μm. The third thickness may range from 10 μm to 100 μm.

The front metal layer and the back metal layer may include copper (Cu).

The wafer level chip scale package may further include a polyimide layer surrounding the front metal layer; and a seed metal layer formed on the front metal layer.

The front metal layer may be formed on the semiconductor substrate except for the input-output pad.

In a process of mounting the wafer level chip scale package on a PCB substrate, a warpage of the back metal layer may be offset by the front metal layer and the polyimide layer.

The front metal layer and the back metal layer are formed of a same metal having a same coefficient of thermal expansion.

The metal bump may comprise a solderable metal layer.

In another general aspect, a wafer level chip scale package may include a semiconductor substrate having a first thickness; a front metal layer having a second thickness formed on an upper surface of the semiconductor substrate; and a back metal layer having a third thickness formed on a lower surface of the semiconductor substrate, wherein the front metal layer and the back metal layer have a same coefficient of thermal expansion, such that the package is configured to maintain a balanced state when the package is mounted on a PCB substrate.

The first thickness is greater than the second thickness, and the third thickness is greater than the first thickness.

In a general aspect, a manufacturing method of a wafer level chip scale package includes preparing a semiconductor substrate having a first thickness; forming a first seed metal layer on the semiconductor substrate; forming a photo mask pattern on the first seed metal layer and forming a front metal layer having a second thickness; removing the photo mask pattern and the first seed metal layer that are formed in a region except for the front metal layer; forming a polyimide layer on the semiconductor substrate; forming a second seed metal layer on the polyimide layer; forming a metal bump on the second seed metal layer; and forming a back metal layer having a third thickness on a lower surface of the semiconductor substrate.

The second thickness of the front metal layer may be the thinnest, and the third thickness of the back metal layer may be the thickest.

The first thickness may be less than 60 μm, and the second thickness may range from 10 μm to 60 μm, and the third thickness may range from 10 μm to 100 μm.

A warpage of the back metal layer may be offset by the front metal layer and the polyimide layer, and therefore, the wafer level chip scale package mounted on a PCB substrate may maintain a balanced state.

The manufacturing method of a wafer level chip scale package may further include forming an input-output pad on the semiconductor substrate, and the front metal layer may be formed on an entire area of the semiconductor substrate except for the input-output pad.

Other features and aspects will be apparent from the following detailed description, the drawings, and the claims.

BRIEF DESCRIPTION OF THE DRAWINGS

FIGS. 3A and 3B illustrate cross-sectional views of a wafer level chip scale package structure of a power semiconductor in accordance with one or more embodiments of the disclosure.

FIGS. 6A to 6L illustrate each operation of process manufacturing a wafer level chip scale package of a power semiconductor in accordance with one or more embodiments of the disclosure.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
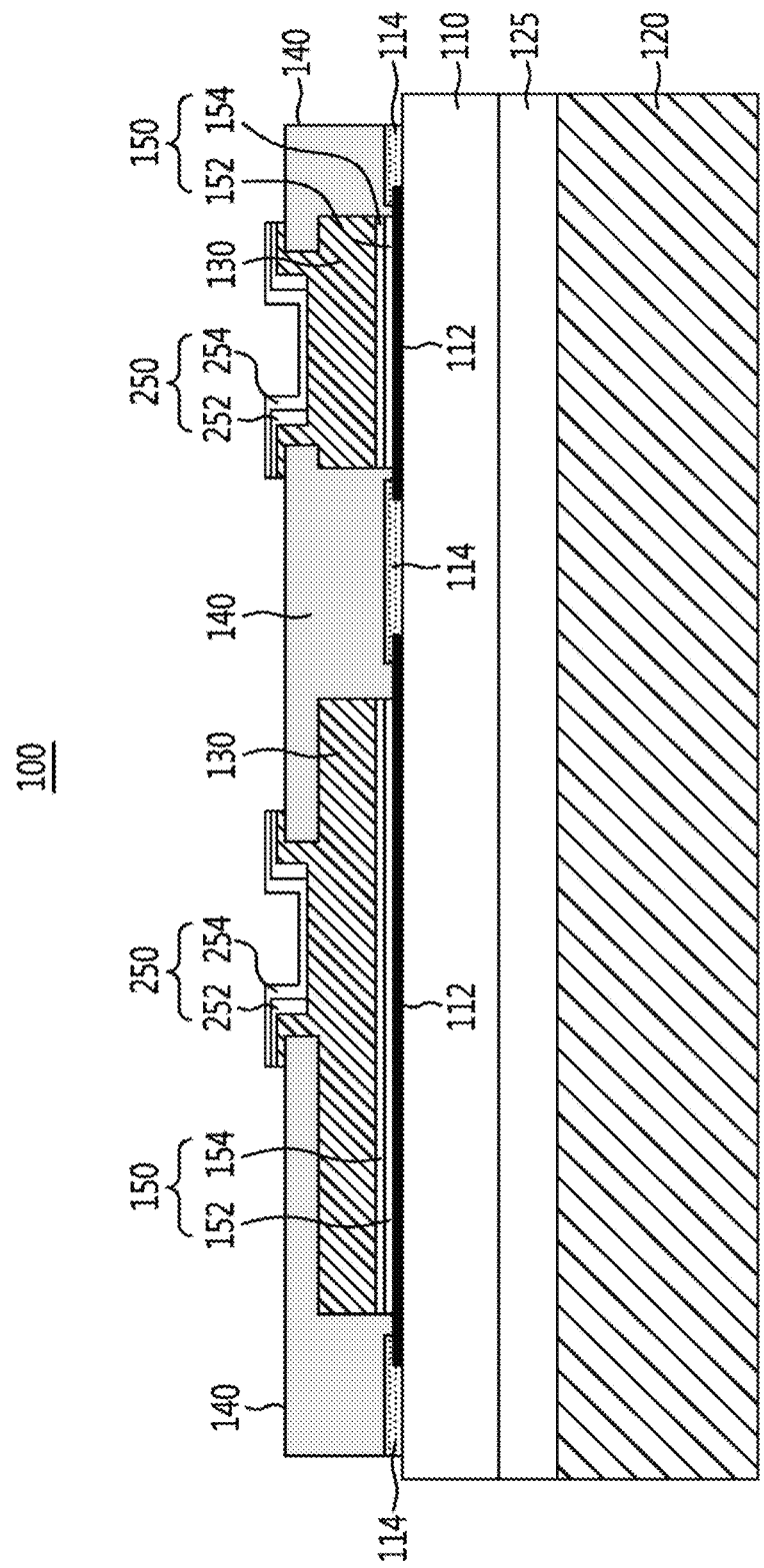
FIG. 1 illustrates a wafer level chip scale package in accordance with one or more embodiments of the disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

To solve the above problems, the disclosure may provide a wafer level chip scale package and manufacturing method thereof to prevent a warpage of a package by forming metal layers on opposite sides of a semiconductor substrate.

The one or more examples may also provide a wafer level chip scale package and manufacturing method thereof to be applied to various power semiconductors that desire a lower on resistance (Low Ron), that is, a low drain-source resistance (Low Rdson) and low source-source resistance (Rsson).

A targeted problem of the disclosure is not limited by the problems mentioned above. A person skilled in the relevant field of technology may understand other problems from the following description.

A detailed description will be given below, with attached drawings.

A power semiconductor, according to one or more examples, may implement a vertical power MOSFET device forming a vertical channel, but it is not limited thereto. A trench power MOSFET semiconductor device or a planar MOSFET semiconductor device, etc. may be included.

FIG. 1 illustrates a wafer level chip scale package in accordance with one or more embodiments.

As illustrated in FIG. 1, a semiconductor device 100 may include a semiconductor substrate 110 having a first thickness and a back metal layer (a second metal layer) 120 having a third thickness and formed on a bottom of the semiconductor substrate 110. In an example, the first thickness may be less than 60 µm, and the third thickness may range from 10 µm to 100 µm. The back metal layer 120 may be thicker than the semiconductor substrate 110.

As shown in FIG. 1, the semiconductor device 100 may include an input-output pad 112 formed on the semiconductor substrate 110. The input-output pad 112 may be formed in a 1:1 correspondence with a metal bump, which will be described below. The input-output pad 112 may be spaced from an adjacent input-output pad with a certain distance. A protective film 114 or a passivation film may be formed between the input-output pads 112 in order to protect integrated circuits (not shown) that are formed on the semiconductor substrate from external air or water. A silicon oxide film ($SiO_2$) and silicon nitride film (SiN), a stacked structure by a silicon oxide film ($SiO_2$) and silicon nitride film (SiN), and a silicon oxynitride film (SiON), etc. may be implemented for the passivation film. The protective film 114 may be overlapped with a portion of the input-output pad 112.

The semiconductor device 100 may include a front metal layer (a first metal layer) 130 formed on the input-output pad 112. The front metal layer 130 may not be formed not only in a bottom of the metal bump, but it may be formed enough to be extended in right and left directions. The front metal layer 130 may have a second thickness. The second thickness may range from 10 µm to 60 µm.

The semiconductor device 100 may include a polyimide layer 140 to easily form the metal bump on the protective film 114 and the front metal layer 130. As the front metal layer 130 has the second thickness, the polyimide layer 140 may be thicker than a typical case.

According to the configuration, thicknesses may be formed thicker in the order of the front metal layer 130, the semiconductor substrate 110, and the back metal layer 120. When the front metal layer 130 has the second thickness, the layer may have a similar coefficient of thermal expansion (CTE) of the back metal layer 120 due to a cooperation of the front metal layer 130 and the polyimide layer 140. Therefore, a package warpage may be prevented.

In the semiconductor device 100 of FIG. 1, the input-output pad 112 may be formed on an upper surface of the semiconductor substrate 110, and a first seed metal layer 150 may be formed on the input-output pad 112. The first seed metal layer 150 may implement a stacked structure of a Ti layer or TiW layer 152 and Cu layer 154, and it may be deposited by a sputtering method. When the front metal layer 130 is deposited, the first seed metal layer 150 may enhance adhesions of the input-output pad 112 with the front metal layer 130. When the first seed metal layer 150 is not formed, the front metal layer 130 may be peeled off from the input-output pad 112 in a subsequent process because the adhesion to the input-output pad 112 is not good.

A second seed metal layer 250 may be formed on the front metal layer 130. The second seed metal layer 250 may be provided to enhance adhesions of the metal bump 400 (FIG. 6I) with the front metal layer 130. A seed metal implemented in the second seed metal layer 250 may be titanium (Ti) or a stacked structure of titanium tungsten (TiW) 252 and copper (Cu) 254. The second seed metal layer 250 may be deposited by a sputtering method, but it is not limited thereto.

The metal bump 400 may be formed on the second seed metal layer 250. The metal bump 400 may implement a structure of a solderable metal layer 200, not solder ball, resulting in reducing the entire thickness of a package. The solderable metal layer 200 may be stacked in the order of copper (Cu), nickel (Ni), and gold (Au) from the bottom. In the FIG. 1, the back metal layer 120 as a common drain electrode may be formed on the opposite side of the semiconductor substrate 110. The third thickness of the back metal layer 120 may range from 10 µm to 100 µm. The thickness of the back metal layer 120 may be desirable to be thick in order to reduce a resistance of a drain electrode. A metal having an excellent conductivity such as copper (Cu) or silver (Ag) may be generally implemented for the back metal layer 120.

A third seed metal layer 125 may be deposited between the semiconductor substrate 110 and the back metal layer 120 to prevent detachment of the semiconductor substrate 110 from the back metal layer 120. When the back metal layer 120 is directly deposited on the bottom of the semiconductor substrate 110 without depositing the third seed metal layer 125, the semiconductor substrate 110 may be detached from the back metal layer 120. Therefore, a defect may occur afterwards in packaging and PCB mounting, and accordingly, it may not be usable as a product.

Nickel (Ni), nickel vanadium (NiV), silver (Ag), and aluminum (Al) metal may be implemented for the third seed metal layer 125, and a stacked structure of the materials may be also implemented. In an example, a stacked structure such as NiV/Ag, Ti/Ag, or Al/Ti/Ag, etc. may be implemented. The third seed metal layer 125 may be deposited to a thickness of less than 4 µm.

Figure 2:
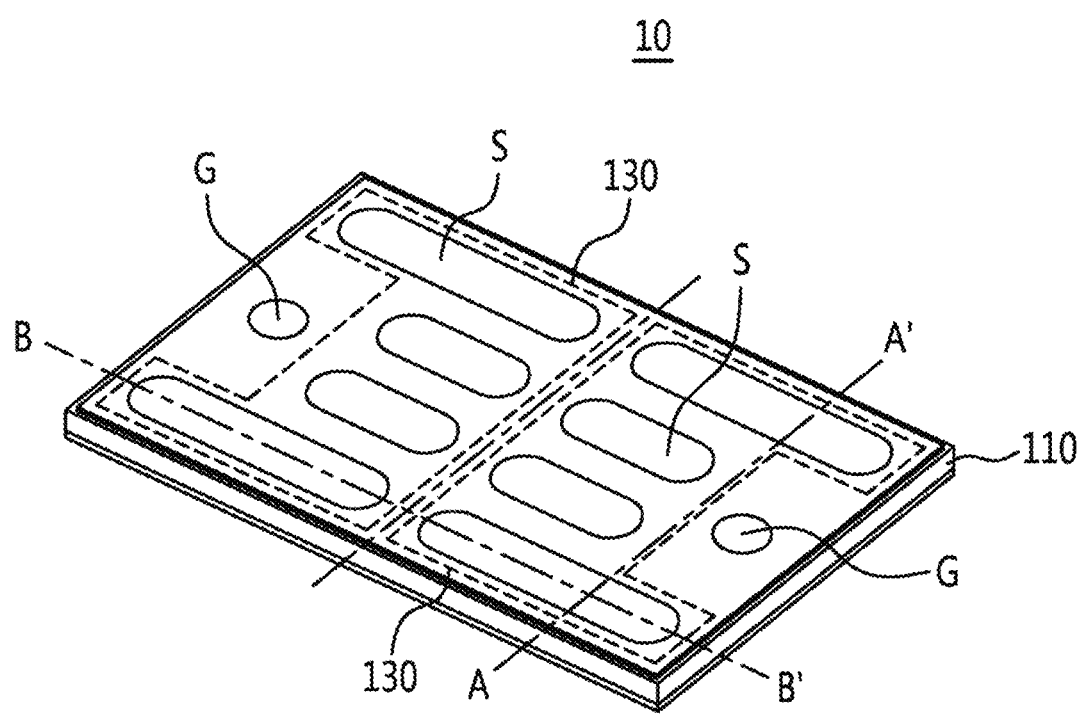
FIG. 2 illustrates a plan view of a power semiconductor described in the disclosure, from a diagonal direction.

FIG. 2 illustrates a plan view of a power semiconductor described in the disclosure, from a diagonal direction.

In FIG. 2, a semiconductor die 10 may have one semiconductor substrate 110. The semiconductor substrate 110 may have a virtual reference surface. Based on the reference surface, trench semiconductor devices may be formed in the semiconductor die 10 side by side, and the semiconductor devices may be physically separated by the virtual reference surface. A source electrode pad (S) and a gate electrode pad (G), etc. may be formed in each semiconductor device, and the source electrode pad (S) and the gate electrode pad (G) located in each semiconductor device may be physically separated.

It may be desirable that a size of the source electrode pad (S) is larger than a size of the gate electrode pad (G) to reduce a resistance of the source electrode pad (S).

The front metal layer 130 may be formed on a bottom of the source electrode pad (S), and the front metal layer 130 is illustrated with dotted lines in the FIG. 2. An area of the front metal layer 130 may be larger than an area of the source electrode pad (S), and the front metal layer 130 may not be formed on the gate electrode pad (G).

Figure 3A:
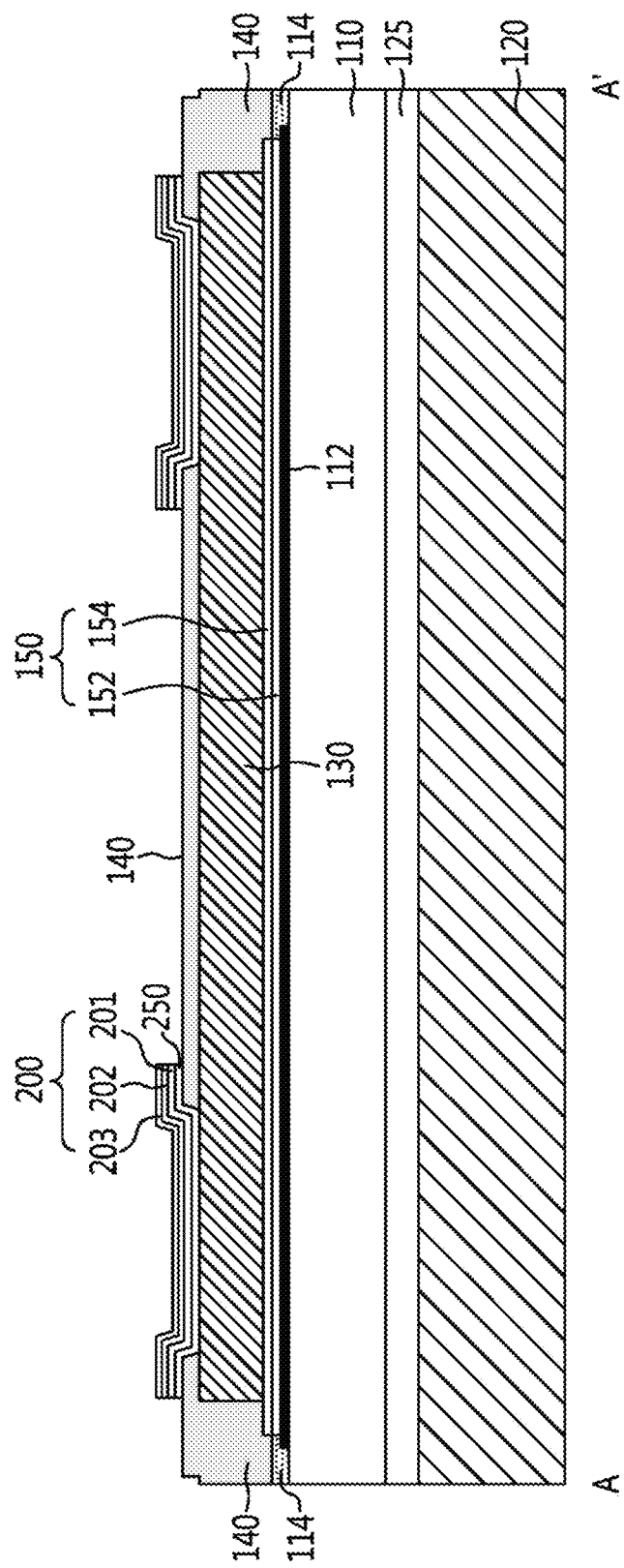

FIG. 3A and FIG. 3B illustrate cross-sectional views of a wafer level chip scale package structure of a power semiconductor in accordance with one or more examples of the disclosure. Herein, cross-sectional views of FIG. 3A and FIG. 3B illustrate thicknesses of the semiconductor substrate 110, the front metal layer (the first metal layer) 130, and the back metal layer (the second metal layer) 120.

FIG. 3A illustrates the cross-sectional view of A-A' in FIG. 2. As illustrated, the semiconductor device may include the semiconductor substrate 110 having the first thickness. The thickness of the semiconductor substrate 110 may be less than 60 μm. The front metal layer 130 may be formed on the semiconductor substrate 110. The second thickness of the front metal layer 130 may range from 10 μm to 60 μm, and it may be considered as an additional region. That is, forming the front metal layer 130 may be for improving a warpage occurring in a typical package structure.

The back metal layer 120 may be formed on the opposite side of the semiconductor substrate 110. The third thickness of the back metal layer 120 may range from 10 μm to 100 μm.

As in the examples, the front metal layer 130, the semiconductor substrate 110, and the back metal layer 120 may be stacked from the top in the semiconductor device of the disclosure. Each thickness may be adjusted with the order of the semiconductor substrate 110, the front metal layer 130, and the back metal layer 120. In an example, when a thickness of the semiconductor substrate 110 is 10 μm, a thickness of the front metal layer 130 may be 20 μm, and a thickness of the back metal layer 120 may be 30 μm. In another example, when a thickness of the back metal layer 120 increases, a thickness of the front metal layer 130 may equally increase. It is because a warpage due to a difference in thermal expansion coefficients of the semiconductor substrate 110 may deteriorate when a thickness of the back metal layer 120 increases, and increasing a thickness of the front metal layer 130 may efficiently prevent the warpage. Nevertheless, according to a semiconductor device application and desired Rsson and Rdson, the semiconductor substrate 110 may be thicker than the front metal layer 130 and the back metal layer 120. That is, it may be desirable to form thicknesses of the front metal layer 130, the semiconductor substrate 110, and the back metal layer 120 to be in the range of the first to third thicknesses of the disclosure, according to an application and for rationalization of on resistance.

By forming the front metal layer 130 and adjusting its thickness, the warpage may be improved, and a low on resistance, that is, a low Rdson and Rsson may be obtained.

The front metal layer 130 and the back metal layer 120 may be composed of the same metal, copper (Cu). Silver (Ag), gold (Au), or aluminum (Al), etc. having a decent conductivity may be also implemented. The reason for implementing the same metal is to prevent the package warpage as much as possible by minimizing a difference in coefficients of thermal expansion or using the same coefficients.

The polyimide layer 140 may be formed on a side and upper portions of the front metal layer 130 to easily form the metal bump 400. The polyimide layer 140 may be thicker than the front metal layer 130. The second seed metal layer 250 and the solderable metal layer 200 may be formed in sequence in a predetermined portion of the front metal layer 130. Copper (Cu) 201-nickel (Ni) 202-gold (Au) 203 may be stacked in sequence for the solderable metal layer 200.

A width of the input-output pad 112 may be wider than that of the first seed metal layer 150, and a width of the first seed metal layer 150 may be wider than that of the front metal layer 130. In an example, the width of the first seed metal layer 150 may be the same as the width of the front metal layer 130.

The protection film 114 may be formed on opposite sides of the input-output pad 112.

FIG. 3B illustrates the cross-sectional view of B-B' in FIG. 2. The structure of FIG. 3B is similar to the above-described structure of FIG. 3A.

The semiconductor substrate 110 and the front metal layer 130 formed on the semiconductor substrate 110 may be included. Herein, the front metal layer 130 may be physically separated by the virtual reference surface.

The polyimide layer 140 may be formed on a side and upper portions of the front metal layer 130. The second seed metal layer 250 and the solderable metal layer 200 may be formed in sequence in between the polyimide layer.

Like FIG. 3A, in the structure of FIG. 3B, the semiconductor substrate 110 may have a thickness less than 60 μm. The front metal layer 130 may have a thickness of 10~60 μm, and the back metal layer 120 may have a thickness of 10~100 μm. Like FIG. 3A, their thicknesses may be thicker in the order of the substrate 110, the front metal layer 130, and the back metal layer 120. According to an application, the semiconductor substrate 110 may be thicker than the front metal layer 130 and the back metal layer 120. That is, it may be desirable to form thicknesses of the front metal layer 130, the semiconductor substrate 110, and the back metal layer 120 to be in the range of the first to third thicknesses, according to an application and for rationalization of on resistance.

A width of the input-output pad 112 may be wider than that of the first seed metal layer 150, and a width of the first seed metal layer 150 may be wider than that of the front metal layer 130. In an example, the width of the first seed metal layer 150 may be identical with that of the front metal layer 130.

Figure 4:
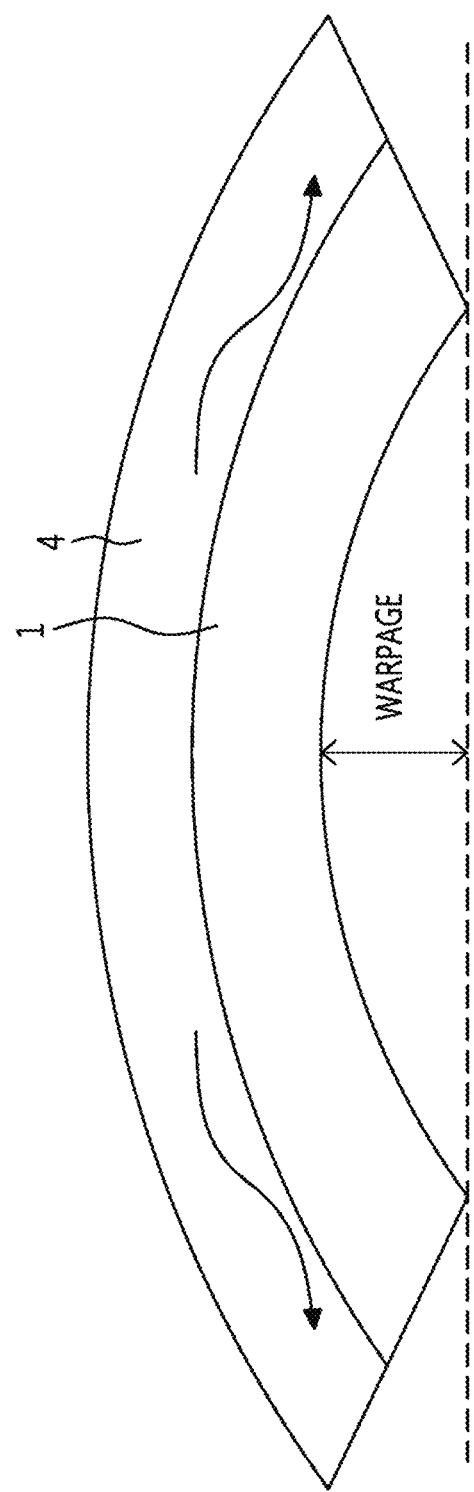
FIG. 4 illustrates a warpage of a typical wafer level chip scale package.
Figure 5:
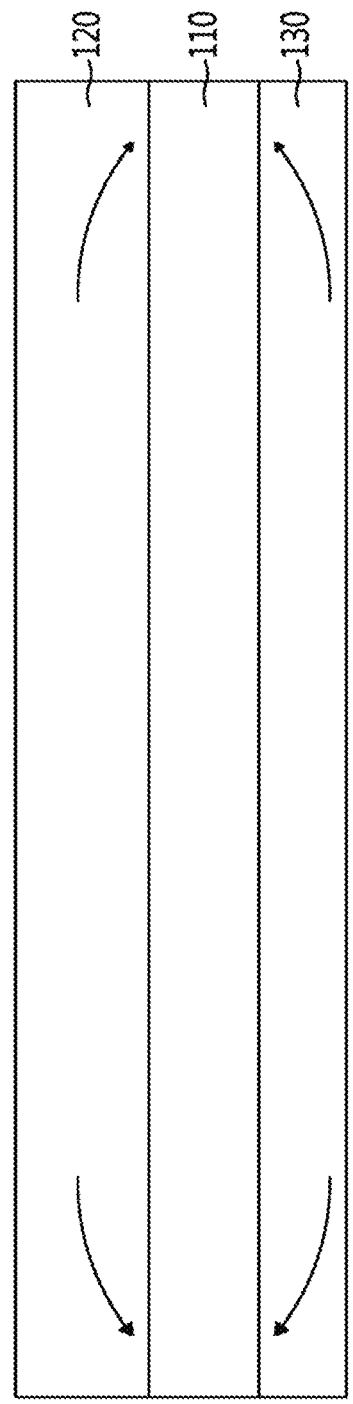
FIG. 5 illustrates a wafer level chip scale package of the disclosure without warpage.

FIG. 4 illustrates a warpage of a typical wafer level chip scale package, and FIG. 5 illustrates a wafer level chip scale package of the disclosure without warpage.

In FIG. 4, a semiconductor substrate 1 is thin, and a back metal layer 4 is thicker than the semiconductor substrate 1.

Since silicon (Si) of the semiconductor substrate 1 and copper (Cu) of the back metal layer 4 have different coefficients of thermal expansion in FIG. 4, the copper (Cu) of the back metal layer 4 may be thermally expanded more than the silicon (Si) of the semiconductor substrate 1, according to a temperature of a surface mount process. Accordingly, the back metal layer 4 may be stretched. Therefore, the copper (Cu) composing the back metal layer 4 may be warped toward the silicon (Si) composing the semiconductor substrate 1, resulting in warpage.

The coefficient of thermal expansion of copper (Cu) is 17 ppm/'C, and the coefficient of thermal expansion of Si is 3 ppm/'C. When a temperature rises during the packaging process afterwards, the copper (Cu) composing the back metal layer 4 may be convexly warped due to a thermal expansion of the back metal layer 4, which is attached to the semiconductor substrate 1.

On the other hand, in the structure of the disclosure illustrated in FIG. 5, the front metal layer 130 having a predetermined thickness may be formed on the semiconductor substrate 110, in addition to the semiconductor substrate 110 and the back metal layer 120. Then, the front metal layer 130 and the back metal layer 120 may by stretched up and down in between the semiconductor substrate 110 in the surface mount process. That is, the front metal layer 130 and the back metal layer 120 may be warped toward the semiconductor substrate 110. In this example, since each force of warpage is offset, a package may remain a balanced state. Therefore, the warpage may not occur in the package.

FIGS. 6A to 6L illustrate each process of manufacturing a wafer level chip scale package of a power semiconductor in accordance with one or more examples of the disclosure.

As shown in FIG. 6A, the semiconductor substrate 110 may have a thickness of approximately 100~300 µm. Semiconductor devices may be formed on the semiconductor substrate 110. The input-output pad 112 may be formed on the front of the semiconductor substrate 110. The input-output pad 112 may generally include aluminum (Al), and it may refer to a source electrode pad or gate electrode pad. The protective film 114, which may be thicker than the pad, may be formed in left/right ends of the input-output pad 112.

Figure 6B:
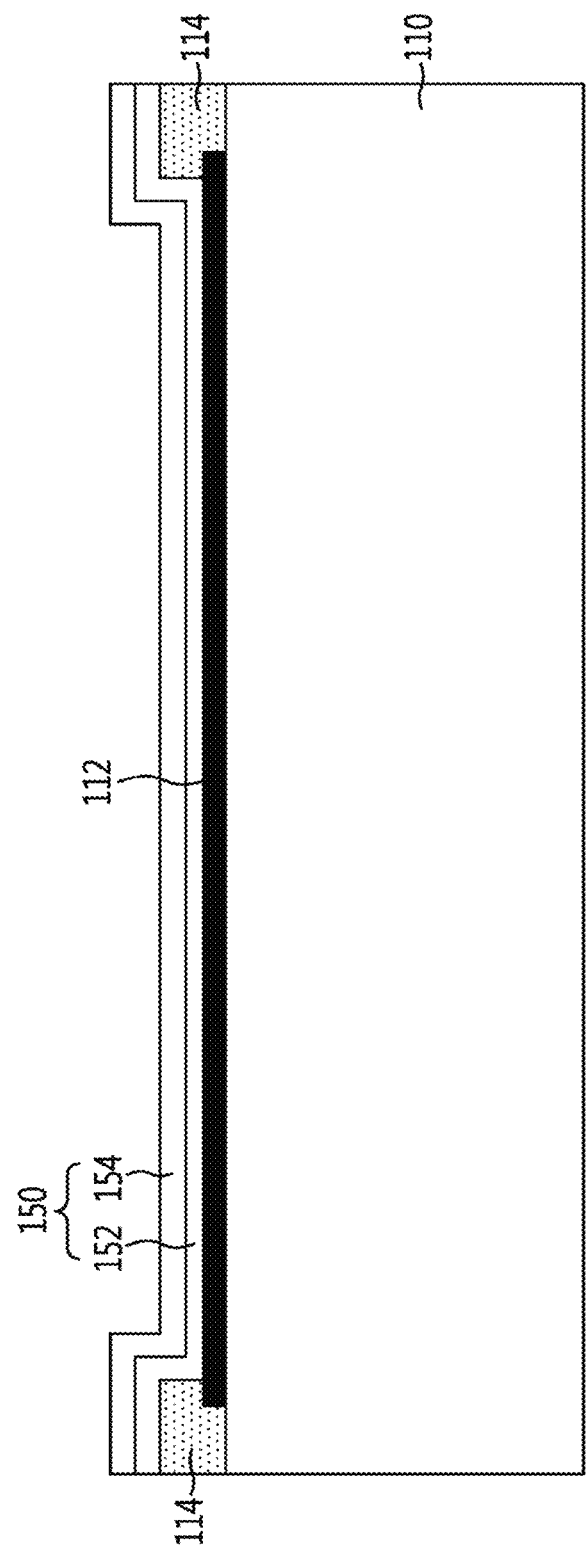

As shown in FIG. 6B, the first seed metal layer 150 may be deposited on the input-output pad 112 and the protective film 114. The first seed metal layer 150 may improve an adhesion between aluminum (Al) of the input-output pad 112 and copper (Cu) of the front metal layer 130 that will be formed later. Titanium (Ti) 152, titanium tungsten (TiW) 152, and copper (Cu) 154 may be implemented as a seed metal for the first seed metal layer 150. The titanium (Ti) layer or titanium tungsten (TiW) layer 152 and the copper (Cu) layer 154 may be sequentially formed upward from the input-output pad 112, and the first seed metal layer 150 may be deposited by a sputtering method, but is not limited thereto.

Figure 6C:
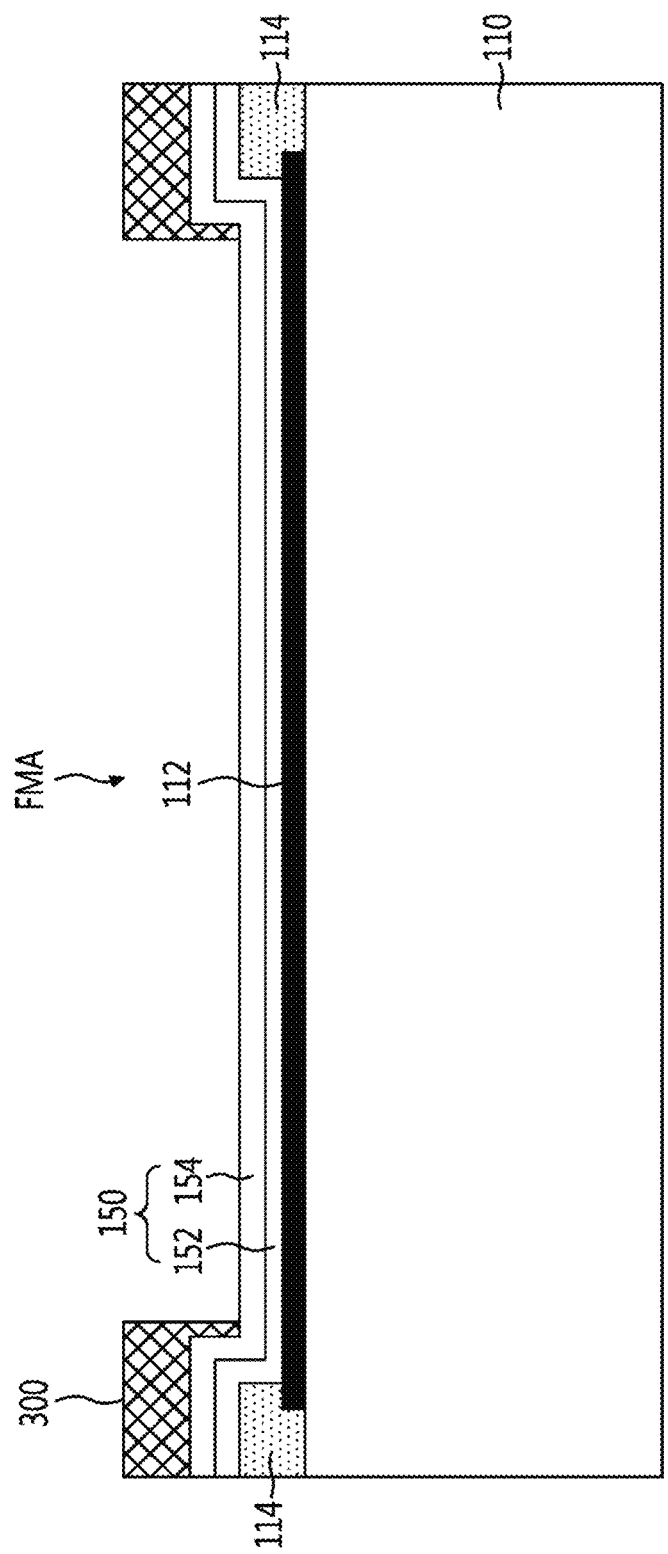

As illustrated in FIG. 6C, a photo resist pattern 300 may be deposited with a predetermined thickness in the first seed metal layer 150. The photo resist pattern 300 may be formed in left and right regions except for a front metal area (FMA) where the front metal layer 130 is formed. The center of FIG. 6C is the front metal area (FMA). The photo resist pattern 300 may be formed in regions facing each other to a predetermined thickness except for the FMA.

Figure 6D:
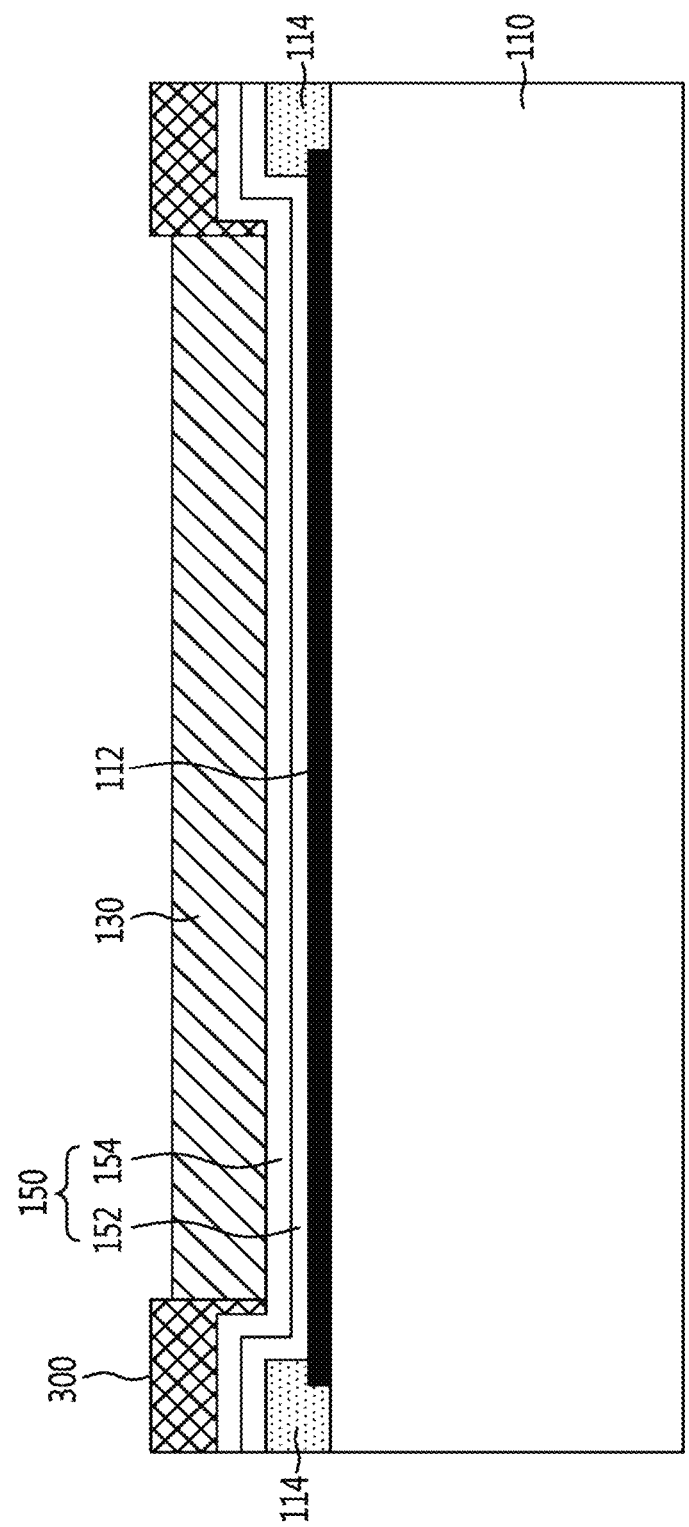

As shown in FIG. 6D, the front metal layer 130 may be formed on the first seed metal layer 150 so that it has the second thickness (10~60 µm) in the front metal area (FMA). The second thickness may be thinner than the first thickness of the semiconductor substrate 110. The front metal layer 130 may be formed of copper (Cu). The same metal may be used for the back metal layer 120 to be formed later. In an example, a metal having a thermal expansion coefficient similar to that of the back metal layer 120 may be implemented.

Additionally, through an electrolyte plating process and electronic plating process on the first seed metal layer 150, the front metal layer 130 may be formed to a desired thickness.

A width of the front metal layer 130 may be narrower than a width of the semiconductor substrate 110.

Figure 6E:
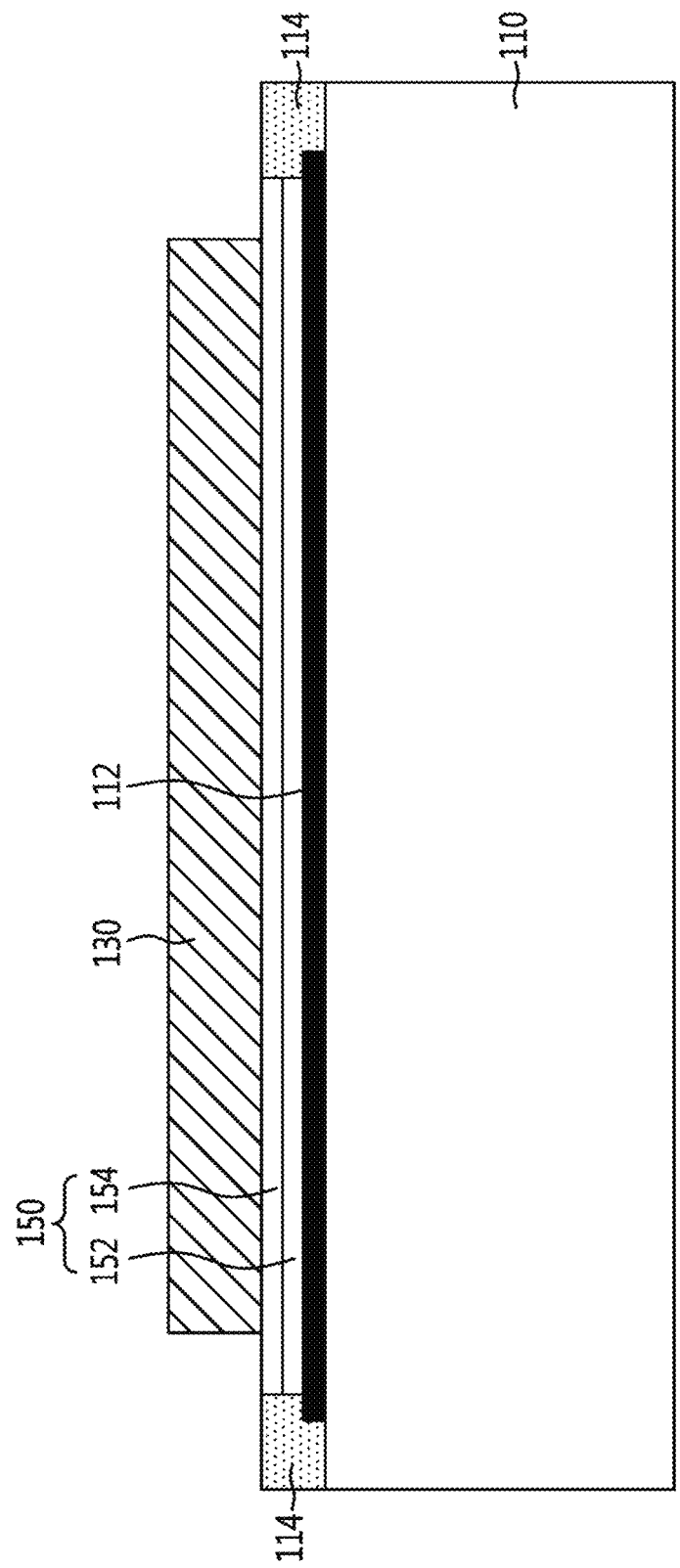

As illustrated in FIG. 6E, the photo resist pattern 300 and a portion of the first seed metal layer 150 in a region except for the front metal layer 130 may be removed. Herein, the photo resist pattern 300 may be removed by a PR strip process using a wet etch process or a plasma process, etc. The first seed metal layer 150 may be removed by an etching process. That is, two removal processes including a first etching process of Ti 152 or TiW 152 and a second etching process of Cu 154 may be performed. The first seed metal layer 150 may remain on a bottom of the first metal layer 130. Since a portion of the first seed metal layer 150 is removed after the second etching process, a width of the first seed metal layer 150 may be narrower than a width of the input-output pad 112.

According to the process, the front metal layer 130 having the second thickness may be formed on the top of the semiconductor substrate 110 having the first thickness. The front metal layer 130 may prevent the package from bending in a subsequent package mounting process.

As illustrated in FIG. 6F, the polyimide layer 140 may be formed in a region except for a metal bump (solderable metal layer) formation area (MBFA, Metal Bump Formation Area). The step of forming the polyimide is omitted. The polyimide layer 140 may be divided into a first polyimide pattern 140b on the front metal layer 130 and a second polyimide layer 140a on the protective film 114 and a side of the front metal layer 130. The first polyimide layer 140b and the second polyimide layer 140a may be spaced apart from each other by a predetermined distance. The spaced distance may be the metal bump formation area (MBFA).

The first polyimide layer 140b and the second polyimide layer 140a may have different thickness. It is because top surfaces of the first polyimide layer 140b and the second polyimide layer 140a are even, and the first polyimide layer 140b is formed directly on the front metal layer 130, and the second polyimide layer 140a is formed on an upper surface of the protective film 114. The second polyimide layer 140a may be thicker than the first polyimide layer 140b.

Figure 6G:
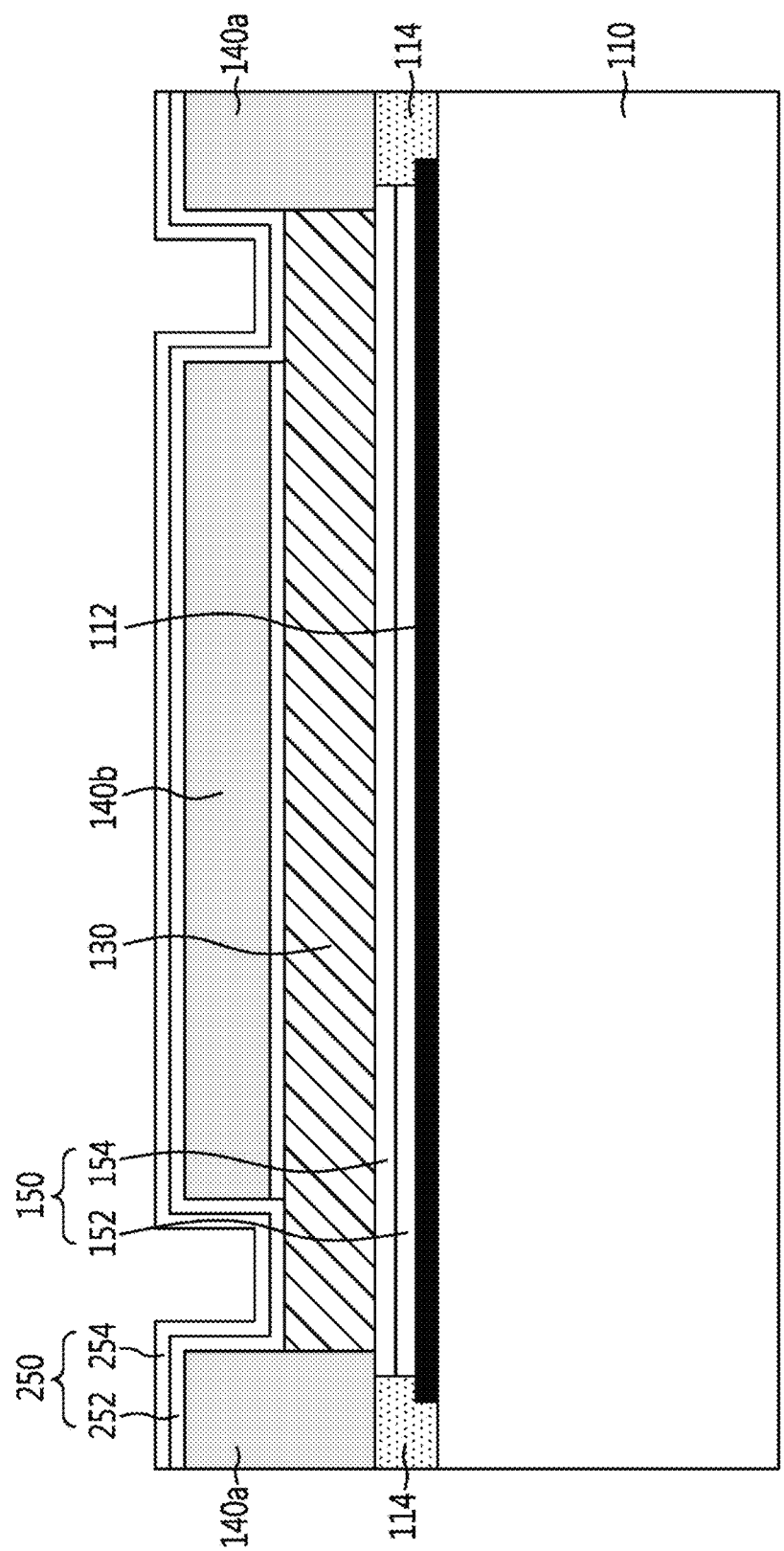

As illustrated in FIG. 6G, the second seed metal layer 250 may be formed on the polyimide layer 140 and the front metal layer 130. The second seed metal layer 250 may directly contact the polyimide layer 140 and the front metal layer 130. Titanium (Ti), titanium tungsten (TiW), or copper (Cu) may be implemented as a seed metal of the second seed metal layer 250. Like the first seed metal layer 150, the second seed metal layer 250 may be also deposited by a sputtering method, but is not limited thereto.

Figure 6H:
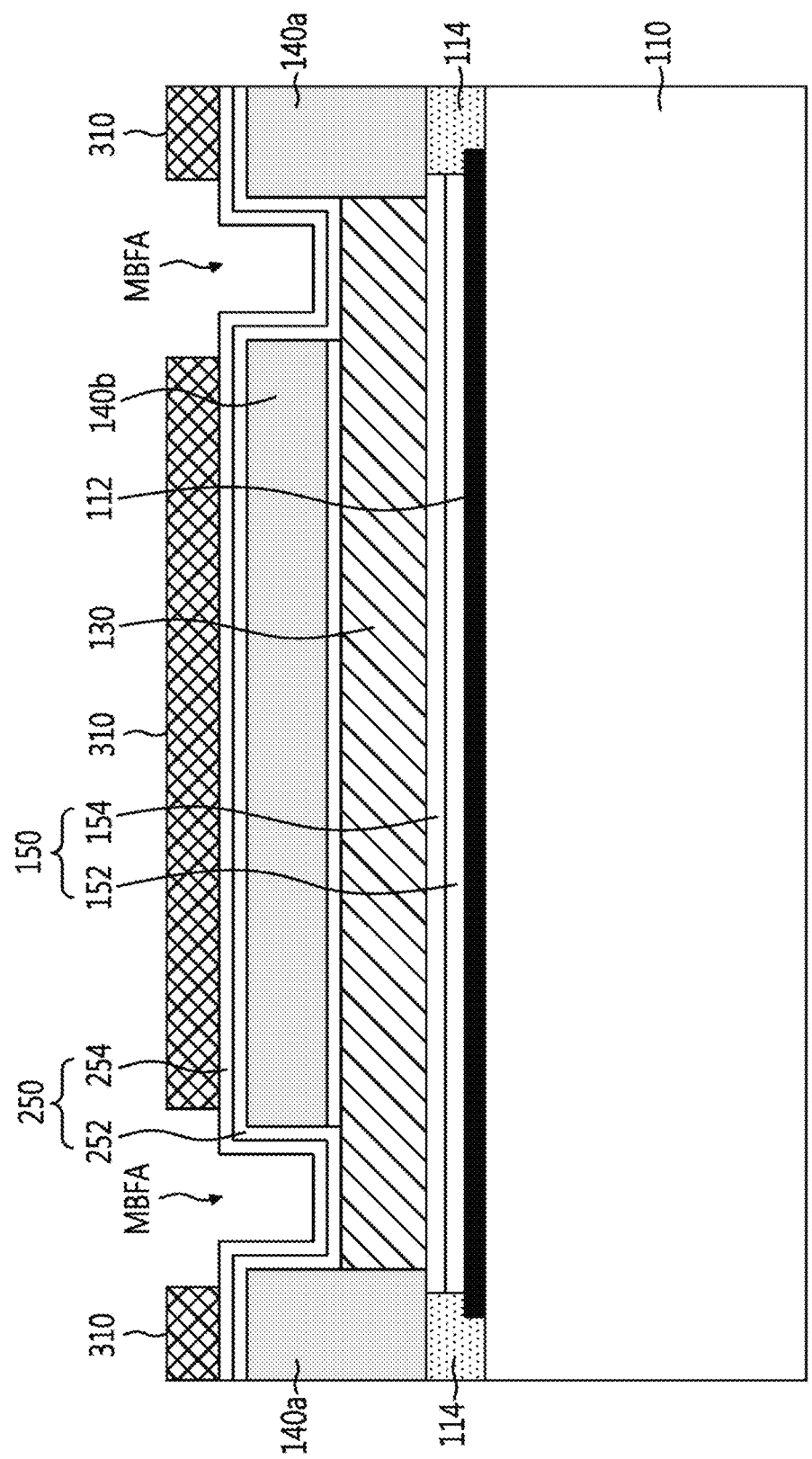

As illustrated in FIG. 6H, a photoresist pattern 310 may be formed on an upper surface of the semiconductor substrate where the second seed metal layer 250 is deposited in order to form the metal bump. The photoresist pattern 310 may be formed in a region except for the MBFA.

As illustrated in FIG. 6I, the metal bump 400 may be formed in the metal bump formation area (MBFA). Herein, the metal bump 400 may be composed of the solderable metal layer 200, which was mentioned earlier, to reduce the entire thickness of a package. The solderable metal layer 200 may include copper, nickel, and gold, and other metals with suitable electrical conductivity may be implemented instead of copper. The stacking order may be copper, nickel, and gold from the bottom.

Figure 6J:
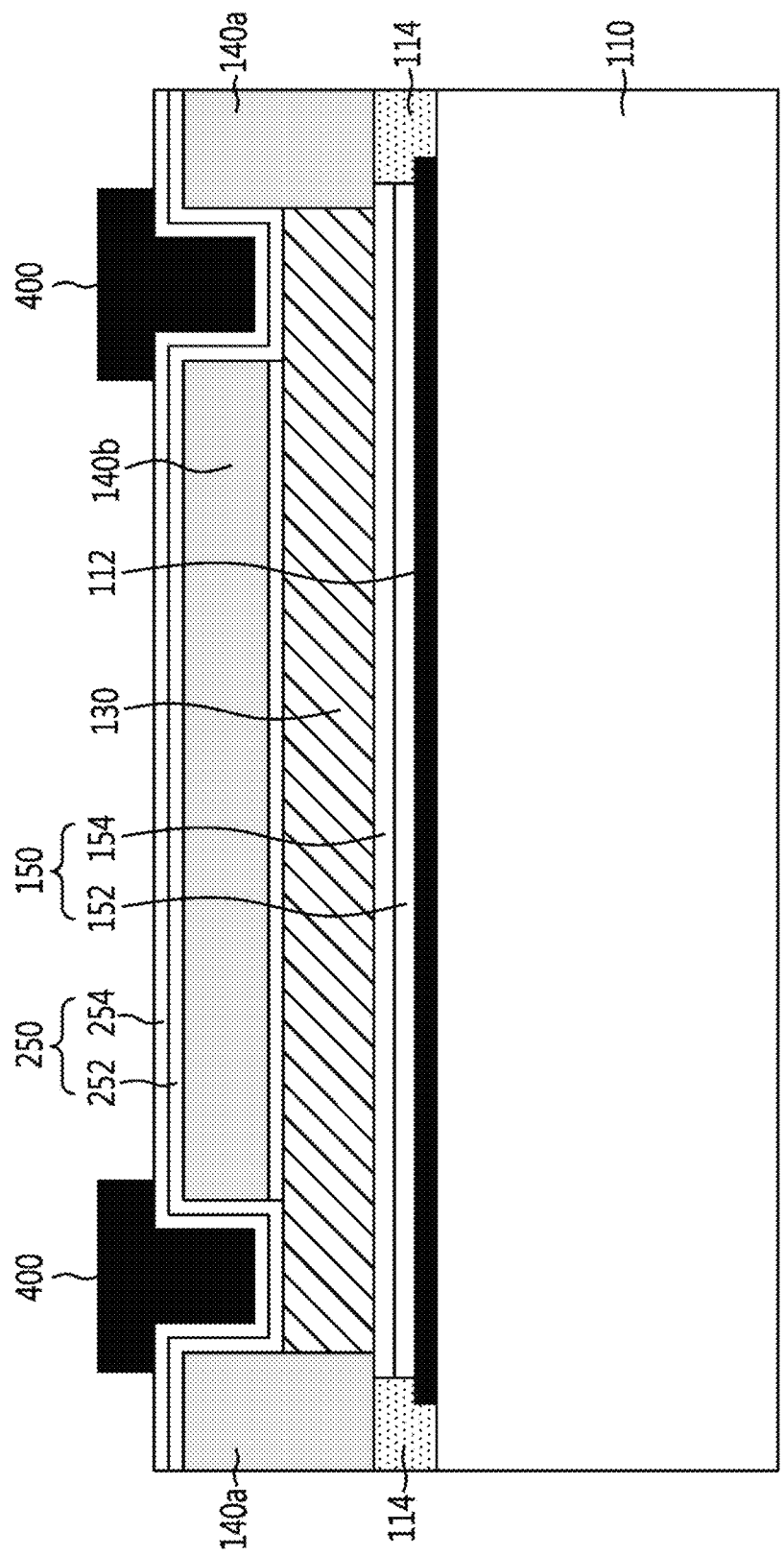

As illustrated in FIG. 6J, the photoresist pattern 310 may be removed after forming the metal bump 400. The photoresist pattern 310 may be removed by a PR strip process using a wet etch process or a plasma process, etc.

Figure 6K:
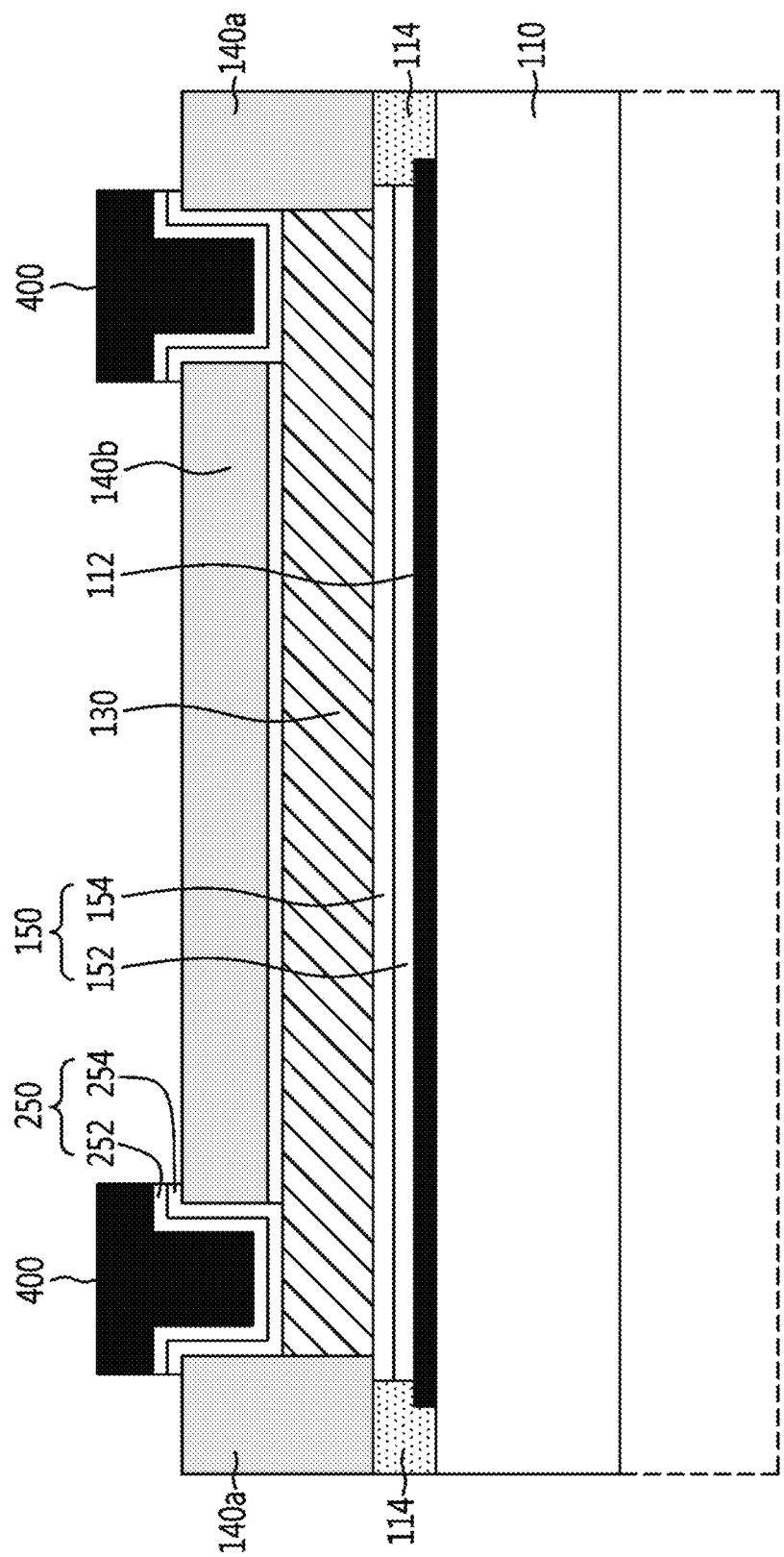

As illustrated in FIG. 6K, after removing the photoresist pattern 310, the second seed metal layer 250 may be removed that is exposed by the removal of the photoresist pattern 310. After the second seed metal layer (Ti or TiW, Cu) 250 is removed, which is deposited in a portion except for the metal bump 400, the formation of the metal bump 400 is completed.

Subsequently, a bottom thickness of the semiconductor substrate 110 may be reduced by a polishing process and Chemical Mechanical Polishing (CMP) process. Through the polishing process and Chemical Mechanical Polishing (CMP) process, the semiconductor substrate 110 may have a thin thickness of about 60 µm or less. The portion expressed with dotted lines is the reduced portion.

Next, as illustrated in FIG. 6L, the third seed metal layer 125 may be formed on the bottom of the semiconductor substrate 110. The third seed metal layer 125 may improve an adhesion between the bottom of the semiconductor substrate 110 and the back metal layer 120. The third seed metal layer 125 may be formed with nickel (Ni) or nickel vanadium (NiV) metal with a thickness of less than 4 µm. The third seed metal layer 125 may be deposited by a sputtering method. The third seed metal layer 125 may improve an adhesion with the back metal layer 120, and silver (Ag) may be additionally stacked in the third seed metal layer 125. A silver layer may prevent an oxidation of nickel vanadium (NiV) because nickel (Ni) and nickel vanadium (NiV) may be easily oxidized. Therefore, the back metal deposition process may not perform well afterwards. Ti only may be implemented for the third seed metal layer 125, or three layers of Ti/NiV/Ag may be stacked. After forming the third seed metal layer 125, the back metal layer 120 having the third thickness (10~100 µm) may be formed. A thickness of the back metal layer 120 may be thicker than the first thickness of the semiconductor substrate 110 and the second thickness of the front metal layer 130.

According to the above manufacturing process, a package may be formed in which the front metal layer 130 having a predetermined thickness is formed on the top of the semiconductor substrate 110. Also, by forming the front metal layer 130, a warpage due to a difference of coefficients of thermal expansion of the semiconductor substrate 110 and the back metal layer 120 may be prevented. Therefore, the package warpage may not occur in a surface mount technology (SMT) process of mounting the package into a PCB substrate.

Figure 7:
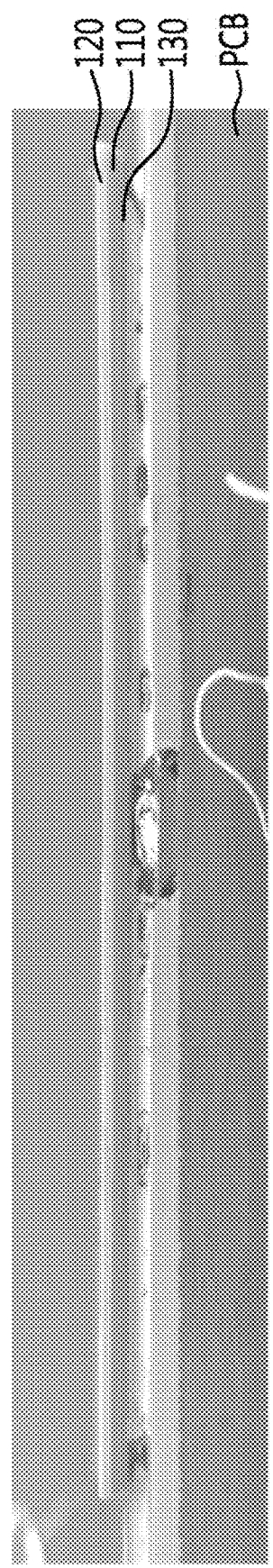
FIGS. 7 and 8 illustrate SEM photos showing a warpage of typical package and a package of the disclosure.
Figure 8:
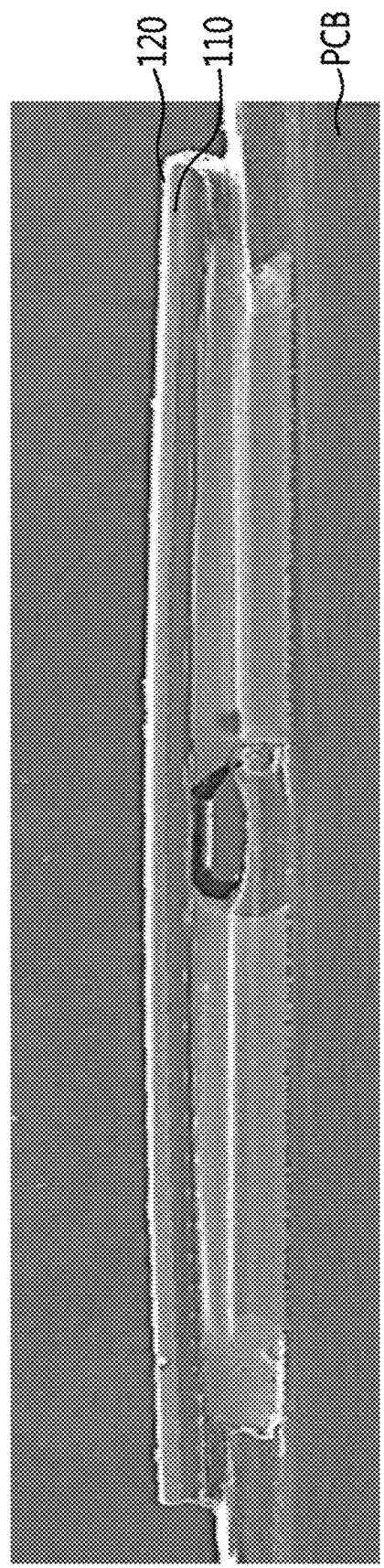

Referring to an actual SEM photo for the package warpage of the disclosure, like FIG. 7, there is no package warpage for the package manufactured by a process of FIG. 6A-L, which is an example of the disclosure. Accordingly, when there is no package warpage, and a desired state is achieved, the package may be precisely mounted into the PCB, and destruction of semiconductor substrate 110 and package and inside crack due to a warpage in the mounting may be prevented. On the other hand, like FIG. 8, since a front metal layer 130 is not formed in a typical package structure, a warpage may not be prevented due to a difference of coefficients of thermal expansions of a semiconductor substrate 110 and a back metal layer 120. Specifically, the warpage may worsen as the semiconductor substrate becomes thinner, and the back metal layer becomes thicker.

According to one or more examples, the warpage of the package may be prevented through the metal layers formed on the upper and lower portions of the semiconductor substrate. In particular, by forming metal layers having an appropriate thickness on the upper and lower portions of the semiconductor substrate with considering a coefficient of thermal expansion of the metal layers, the warpage of a package may be efficiently prevented, improving reliability in package and PCB mounting.

According to one or more examples, through reducing the entire thickness of the package and thickness of the wafer and forming a back metal layer and a front metal layer, various power semiconductors that desire low on-resistance (Low Ron), that is, low drain-source resistance (Low Rdson) and low source-source resistance (Rsson) may be designed.

While this disclosure includes specific examples, it will be apparent after an understanding of the one or more examples of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A wafer-level chip scale package, comprising:
   a semiconductor substrate having a first thickness;
   an input/output pad formed on an upper surface of the semiconductor substrate;
   a front metal layer having a second thickness and formed on the input/output pad;
   a back metal layer having a third thickness and formed on an entire lower surface of the semiconductor substrate,
   wherein the first thickness is greater than the second thickness, and the third thickness is greater than the first thickness; and
   a metal bump formed on the semiconductor substrate,
   wherein the back metal layer is configured to function as a common drain electrode.

2. The wafer level chip scale package of claim 1, wherein the first thickness is less than 60 µm, and the second thickness ranges from 10 µm to 60 µm, and the third thickness ranges from 10 µm to 100 µm.

3. The wafer level chip scale package of claim 1, wherein the front metal layer and the back metal layer include copper (Cu).

4. The wafer level chip scale package of claim 1, further comprising:
   a polyimide layer surrounding the front metal layer; and
   a seed metal layer disposed between the front metal layer and the input-output pad.

5. The wafer level chip scale package of claim 4, wherein the front metal layer and the polyimide layer are configured to offset a warpage of the back metal layer in a process of mounting the wafer level chip scale package on a printed circuit board (PCB) substrate.

6. The wafer level chip scale package of claim 1, wherein the front metal layer and the back metal layer are formed of a same metal having a same coefficient of thermal expansion.

7. The wafer level chip scale package of claim 1, wherein the metal bump comprises a solderable metal layer, and
   wherein the solderable metal layer comprises at least one of copper, nickel, and gold.

8. A wafer-level chip scale package, comprising:
   a semiconductor substrate having a first thickness;
   a front metal layer having a second thickness and formed on an upper surface of the semiconductor substrate; and
   a back metal layer having a third thickness and formed on an entire lower surface of the semiconductor substrate,
   wherein the first thickness is greater than the second thickness,
   wherein the third thickness is greater than the first thickness, and
   wherein the front metal layer and the back metal layer have a same coefficient of thermal expansion, such that the package is configured to maintain a balanced state when mounted on a printed circuit board (PCB) substrate.

9. The wafer level chip scale package of claim 8, wherein the back metal layer is configured to function as a common drain electrode.

10. A manufacturing method of a wafer-level chip scale package, the method comprising:
- preparing a semiconductor substrate having a first thickness;
- forming a first seed metal layer on the semiconductor substrate;
- forming a photoresist pattern on the first seed metal layer and forming a front metal layer having a second thickness;
- removing the photoresist pattern and portions of the first seed metal layer outside the front metal layer;
- forming a polyimide layer on the semiconductor substrate;
- forming a second seed metal layer on the polyimide layer;
- forming a metal bump on the second seed metal layer;
- forming a third seed metal layer on an entire lower surface of the semiconductor substrate; and
- forming a back metal layer having a third thickness on an entire lower surface of the third seed metal layer,
- wherein the first thickness is greater than the second thickness, and the third thickness is greater than the first thickness.

11. The manufacturing method of a wafer level chip scale package of claim 10,
- wherein the back metal layer is configured to function as a common drain electrode, and
- wherein the second thickness of the front metal layer is the thinnest, and the third thickness of the back metal layer is the thickest of the first, second, and third thicknesses.

12. The manufacturing method of a wafer level chip scale package of claim 10,
- wherein the first thickness is less than 60 μm, and the second thickness ranges from 10 μm to 60 μm, and the third thickness ranges from 10 μm to 100 μm.

13. The manufacturing method of a wafer level chip scale package of claim 10,
- wherein the front metal layer and the polyimide layer are configured to offset a warpage of the back metal layer, such that the wafer level chip scale package mounted on a printed circuit board (PCB) substrate maintains a balanced state.

14. The manufacturing method of a wafer level chip scale package of claim 10, further comprising: forming an input-output pad on the semiconductor substrate.

* * * * *